United States Patent
Aoki et al.

(10) Patent No.: US 8,248,502 B2
(45) Date of Patent: Aug. 21, 2012

(54) PHOTOELECTRIC CONVERSION DEVICE AND METHOD FOR MAKING THE SAME

(75) Inventors: Takeshi Aoki, Yokohama (JP); Tadashi Sawayama, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 427 days.

(21) Appl. No.: 12/566,241

(22) Filed: Sep. 24, 2009

(65) Prior Publication Data

US 2010/0079636 A1   Apr. 1, 2010

(30) Foreign Application Priority Data

Sep. 30, 2008   (JP) .................. 2008-253995

(51) Int. Cl.
- *H04N 5/14* (2006.01)
- *H04N 5/335* (2011.01)
- *H01L 21/338* (2006.01)
- *H01L 31/062* (2012.01)
- *H01L 31/113* (2006.01)

(52) U.S. Cl. .................. 348/308; 438/174; 257/292

(58) Field of Classification Search .............. 438/74
See application file for complete search history.

(56) References Cited

U.S. PATENT DOCUMENTS

| 2004/0140564 A1 | 7/2004 | Lee et al. |
| 2006/0049439 A1 | 3/2006 | Oh et al. |
| 2008/0203450 A1* | 8/2008 | Naruse et al. .................. 257/290 |

FOREIGN PATENT DOCUMENTS

| JP | 2002-368203 | 12/2002 |
| JP | 2004-221527 | 8/2004 |
| JP | 2006-080522 | 3/2006 |

* cited by examiner

*Primary Examiner* — Albert Cutler
(74) *Attorney, Agent, or Firm* — Canon U.S.A., Inc. IP Division

(57) ABSTRACT

A photoelectric conversion device includes a semiconductor substrate, a first insulating film on the semiconductor substrate, a second insulating film on the first insulating film, a third insulating film on the second insulating film, and a wiring disposed in the third insulating film, the wiring being a wiring layer closest to the semiconductor substrate. A first plug of a shared contact structure and a second plug are disposed in the first insulating film. A third plug and a first wiring that constitute a dual damascene structure are disposed in the second and third insulating films. The first insulating film is used as an etching stopper film during etching of the second insulating film and the second insulating film is used as an etching stopper film during etching of the third insulating film.

16 Claims, 5 Drawing Sheets

PHOTOELECTRIC CONVERSION DEVICE AND METHOD FOR MAKING THE SAME

BACKGROUND OF THE INVENTION

1. Field of the Invention

The present invention relates to a photoelectric conversion device having a dual damascene structure and a method for making the photoelectric conversion device.

2. Description of the Related Art

Recently, high image quality, reasonably priced digital cameras and video cameras are gaining popularity. These image-input appliances are equipped with charge-coupled device (CCD)-type or metal oxide semiconductor (MOS)-type photoelectric conversion devices. A MOS photoelectric conversion device is constituted by a photoelectric conversion element, a MOS transistor, and other associated components. A MOS transistor can be formed by a complementary MOS (CMOS) process for general semiconductors.

A MOS-type photoelectric conversion device uses a multilayer interconnection structure. Japanese Patent Laid-Open No. 2004-221527 discloses use of copper as a wiring material to decrease the thickness of the wiring and thereby decrease the height of a photoelectric conversion device having a multilayer interconnection structure.

Japanese Patent Laid-Open No. 2002-368203 discloses a shared contact that connects the gate electrode of a MOS transistor to a floating diffusion region in a last-stage amplifier of a CCD-type photoelectric conversion device.

In a photoelectric conversion device, the aperture through which light is incident on a photoelectric conversion element is defined by wiring. Accordingly, in order to increase the light collecting efficiency and improve sensitivity, a wiring layout with a wide aperture allowing light to enter the photoelectric conversion element is desirable. Moreover, since a MOS-type photoelectric conversion device requires a larger number of wiring layers than a CCD-type photoelectric conversion device, the flexibility of designing the wiring layout is low. Thus, when the pixels are miniaturized, the design flexibility of the wiring layout of the MOS-type photoelectric conversion device is further degraded.

Even when the aperture is made wide, it is difficult for oblique light to enter the photoelectric conversion element if the distance between the photoelectric conversion element and the aperture is large. The thicker the insulating film is on the photoelectric conversion element, the larger the amount of light absorbed by the insulating film. This decreases the light collecting efficiency on the photoelectric conversion element.

SUMMARY OF THE INVENTION

The present invention provides a photoelectric conversion device in which the light collecting efficiency on a photoelectric conversion element is improved without decreasing the design flexibility of the wiring layout and a method for making a photoelectric conversion device by which an increase in the thickness of the insulating films can be suppressed.

A first aspect of the present invention provides a method for making a photoelectric conversion device that includes a semiconductor substrate, a photoelectric conversion element and MOS transistors disposed on the semiconductor substrate, and a multilayer interconnection structure constituted by a plurality of wiring layers stacked with insulating films in between, the method including the steps of a) forming a first insulating film on a semiconductor substrate, b) forming a first hole and a second hole in the first insulating film, the first hole exposing a plurality of active regions in the semiconductor substrate, a plurality of gate electrodes of a plurality of MOS transistors, or an active region and a gate electrode of a MOS transistor, and the second hole exposing one of a plurality of active regions in the semiconductor substrate, c) forming conductors in the first hole and the second hole to form a first plug in the first hole and a second plug in the second hole, d) forming a second insulating film on the first insulating film, the first plug, and the second plug, e) forming a third insulating film on the second insulating film, f) forming a first opening for a wiring of a dual damascene structure in the third insulating film while using the second insulating film as an etching stopper, the wiring serving as the bottommost layer of a multilayer interconnection structure, g) forming a second opening for a via for the dual damascene structure, the second opening being formed in the second insulating film and exposing the second plug, and h) forming conductors in the first opening and the second opening to form the dual damascene structure.

A second aspect of the present invention provides a photoelectric conversion device that includes a semiconductor substrate, a photoelectric conversion element and a plurality of MOS transistors disposed on the semiconductor substrate, a first insulating film on the semiconductor substrate, a second insulating film on the first insulating film, and a third insulating film on the second insulating film, a wiring disposed in the third insulating film, the wiring being a wiring layer closest to the semiconductor substrate, a first plug disposed in a first hole formed in the first insulating film, the first plug electrically connecting a plurality of active regions in the semiconductor substrate to each other, gate electrodes of the plurality of MOS transistors to each other, or a gate electrode of a MOS transistor to an active region in the semiconductor substrate, a second plug disposed in a second hole formed in the first insulating film, the second plug being electrically connected to one of a plurality of active regions in the semiconductor substrate, and a third plug disposed in a third hole formed in the second insulating film, the third plug being electrically connected to the second plug to make up a dual damascene structure together with the wiring. The first insulating film is composed of a material that can withstand etching of the second insulating film, and the second insulating film is composed of a material that can withstand etching of the third insulating film.

Further features of the present invention will become apparent from the following description of exemplary embodiments with reference to the attached drawings.

Figure 1:
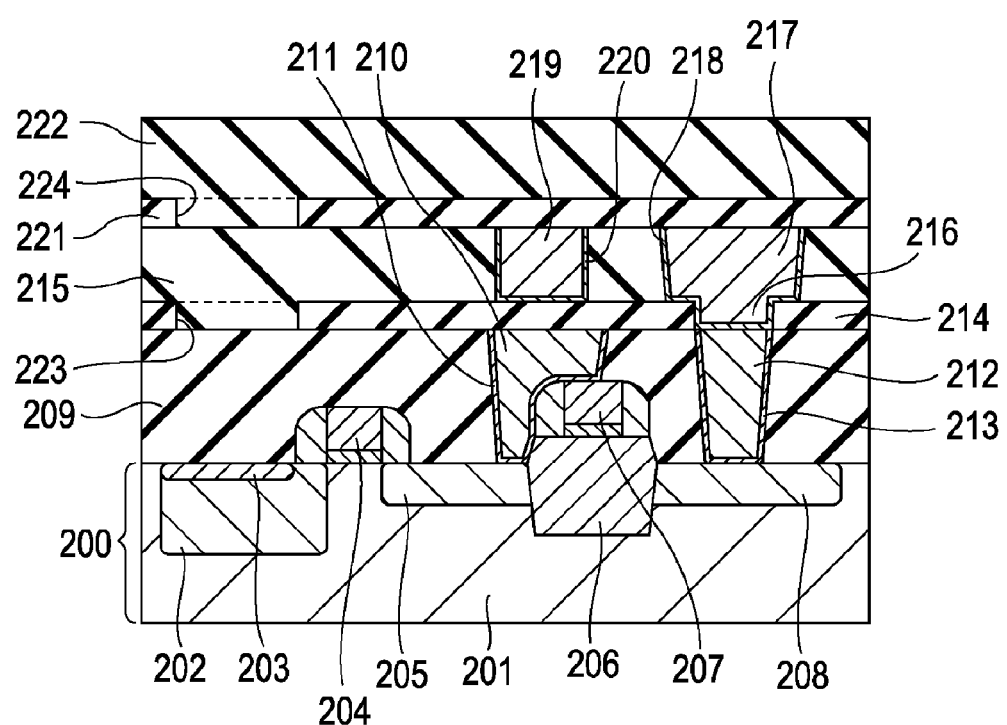
FIG. 1 is a cross-sectional schematic diagram illustrating a first embodiment of the present invention.

The accompanying drawings, which are incorporated in and constitute a part of the specification, illustrate embodiments of the invention and, together with the description, serve to explain the principles of the invention.

DESCRIPTION OF THE EMBODIMENTS

In the present invention, a contact and a shared contact is disposed in a first insulating film, and a dual damascene structure is disposed on the top. A second insulating film in which a via of the dual damascene structure is formed is composed of a material different from those of a third insulating film in which a wiring is formed and the first insulating film. According to this structure, the process margin can be reduced since both the design flexibility of the wiring layout and the controllability of the etching process are improved. Thus, the height of the photoelectric conversion device can be further reduced.

A "contact" is an electrical connecting member that connects an active region to a wiring or a gate electrode to a wiring. A "via" is an electrical connecting member that connects a contact to a wiring or a wiring to another wiring. A contact and a via are each constituted by a plug disposed in a contact hole or a via hole in an insulating layer and a connecting part connected to the plug and an active region or a conductor such as a wiring. The contact and via may each have a barrier metal. A "barrier metal" is a film formed to suppress alloying reaction between the plug material and an insulating film, a substrate, or the like and diffusion of the plug material into an insulating film or a substrate. For the same purpose, a wiring may be provided with a barrier metal. A "dual damascene structure" is a structure including a wiring and a plug formed by a damascene process. A "single damascene structure" is a structure of a wiring formed by a damascene process.

An "aperture" of the photoelectric conversion element is an aperture that defines the path of light incident on the photoelectric conversion element and is usually defined by a pattern that includes wirings and light-shielding films. The pattern that defines the aperture is provided to define the outer edge of the region in which light is incident on the photoelectric conversion element. Which pattern defines the aperture can be identified by conducting optical simulation or the like at a cross section of the photoelectric conversion device.

Hereinafter, a semiconductor substrate serving as a material substrate is expressed as a "substrate" and this includes the following cases of processed material substrates. For example, a component in a state in which one or more semiconductor regions and the like are formed, a component in the midst of a series of manufacturing processes, and a component that has been subjected to a series of manufacturing processes can also be referred to as the "substrate". An "active region" is a semiconductor region partitioned by an element isolation region such as local oxidation of silicon (LOCOS) or the like. It is a region in which various elements are formed or a region that functions as a part of an element. Examples of the active region include a drain region and a source region of a transistor. The direction extending from a main surface of a semiconductor substrate to the interior of the substrate is expressed as "downward direction" and the opposite direction is expressed as "upward direction".

Circuit Configuration of Photoelectric Conversion Device

Figure 4:
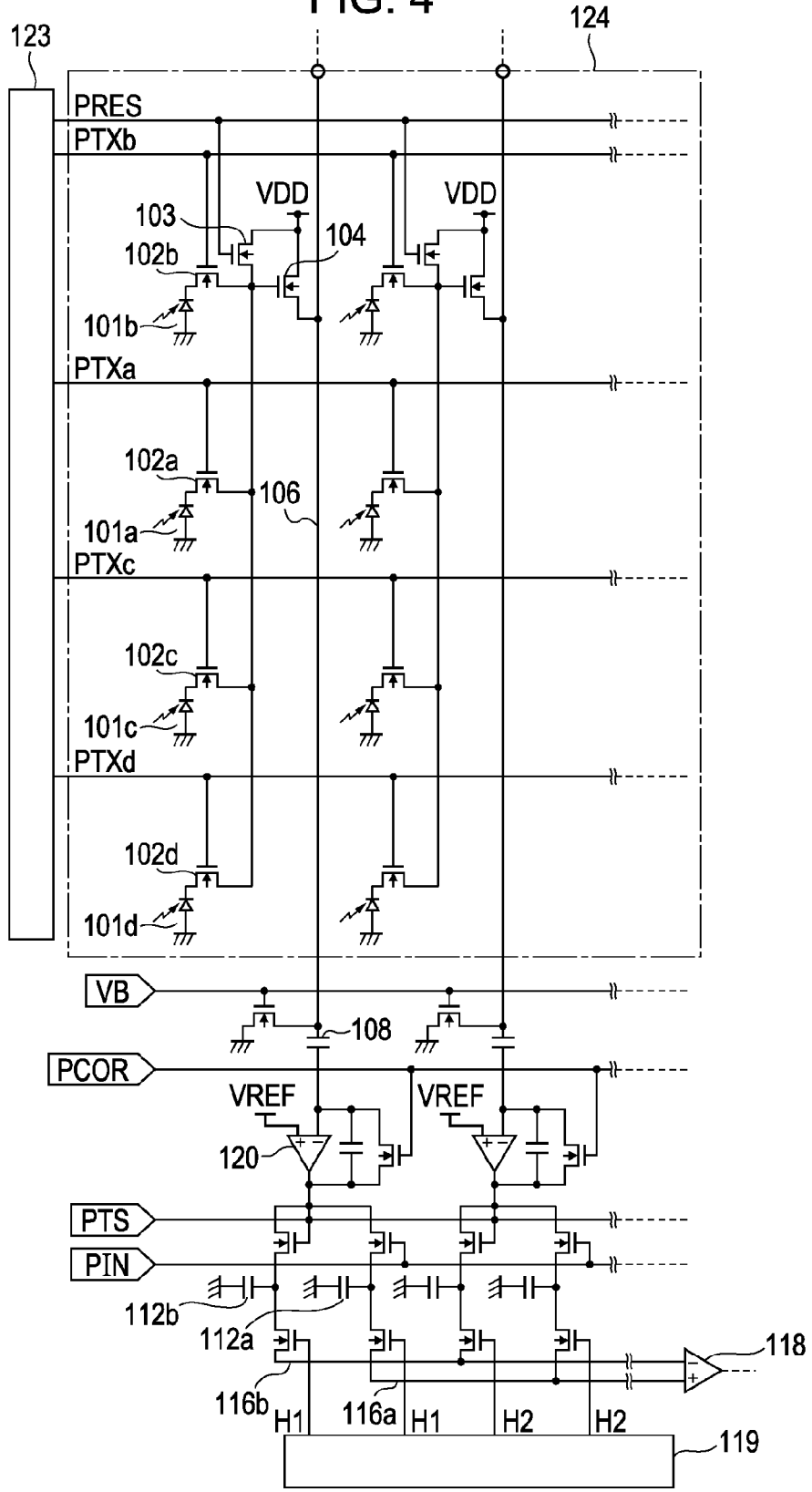
FIG. 4 is a circuit diagram of a photoelectric conversion device.

First, a circuit of a MOS-type photoelectric conversion device to which the present invention can be applied is described. FIG. 4 shows one example of a circuit of a MOS-type photoelectric conversion device. In the circuit, a pixel section 124 is marked by a dotted-chain line. The circuit includes photoelectric conversion elements 101a, 101b, 101c, and 101d, transferring MOS transistors 102a, 102b, 102c, and 102d that transfer charges of the photoelectric conversion elements, a resetting MOS transistor 103 for resetting the drain regions of the transferring MOS transistors 102a, 102b, 102c, and 102d and the photoelectric conversion elements 101a, 101b, 101c, and 101d, and an amplifying MOS transistor 104 that amplifies charges and outputs amplified charges to a signal line 106. The amplifying MOS transistor 104 constitutes part of a source follower circuit. The transferring MOS transistors 102a, 102b, 102c, and 102d, the resetting MOS transistor 103, and the amplifying MOS transistor 104 are referred to as "readout transistors". In FIG. 4, the resetting MOS transistor 103 and the amplifying MOS transistor 104 are shared among the photoelectric conversion elements 101a, 101b, 101c, and 101d. Four such photoelectric conversion elements, four transferring MOS transistors, one resetting MOS transistor, and one amplifying MOS transistor make up one pixel unit. A plurality of pixel units are arranged in the pixel section 124.

A clamp circuit including a clamp capacitor 108, a column amplifier section including an amplifier 120, and a signal holding section including a capacitor 112a and a capacitor 112b are provided for every signal line 106. A scanning circuit 123 and a scanning circuit 119 are provided to drive the readout transistors to read signals generated in the photoelectric conversion elements 101a, 101b, 101c, and 101d via the signal line 106. The signals are subjected to denoising by the clamp circuit and the signal holding section, output to horizontal signal lines 116a and 116b, and finally output from a difference amplifier 118. The scanning circuits, the clamp circuit, and other associated components other than those in the pixel section 124 are collectively referred as a "peripheral circuit section". The transferring MOS transistors 102a, 102b, 102c, and 102d are respectively provided with control lines PTXa, PTXb, PTXc, and PTXd. A control line PRES for resetting MOS transistor 103 is also provided.

The present invention will now be described by way of non-limiting embodiments. These embodiments can be adequately altered and combined without departing from the scope of the present invention.

First Embodiment

A first embodiment of the present invention is described with reference to FIG. 1. FIG. 1 is a cross-sectional schematic diagram of a pixel portion of a photoelectric conversion device and corresponds to a cross-section taken along a photoelectric conversion element 101 and a transferring MOS transistor 102 in FIG. 4.

Referring to FIG. 1, a semiconductor region 201 of a first conductivity type is formed in one main surface of a substrate 200. The first-conductivity-type semiconductor region 201 may be a well or the substrate itself. The substrate 200 also has a second-conductivity-type semiconductor region 202 and a first-conductivity-type region 203 covering the second-conductivity-type semiconductor region 202. A photoelectric conversion element is constituted by the first-conductivity-type semiconductor regions 201 and 203 and the second-conductivity-type semiconductor region 202. A gate electrode 204 of a transferring MOS transistor is provided to transfer charges of the photoelectric conversion element accumulated in the second-conductivity-type semiconductor region 202. The substrate 200 has a second-conductivity-type semiconductor region (floating diffusion region, referred to as "FD region" hereinafter) 205 in which charges of the photoelectric conversion element is transferred. An element isolation region 206 has a shallow trench isolation (STI) structure in this embodiment. The component represented by reference numeral 207 is either a gate electrode of an amplifying MOS transistor forming the source follower circuit or a wiring of the same node as the gate electrode of the amplifying MOS transistor. The gate electrode of each MOS transistor may be continuously formed with the wiring that supplies voltage to the gate electrode. The substrate 200 also has an active region 208 of a first conductivity type or a second conductivity type. In this embodiment, the active region 208 is a source or drain region of an amplifying MOS transistor, for example. Here, the "active region" is a semiconductor region defined by the element isolation region. For example, the active region may be a source or drain region of a MOS transistor or a photoelectric conversion element or a well in which a source or drain region is disposed.

A first insulating film 209 is disposed on the substrate 200. A first plug 210 is disposed in the first insulating film 209. The first plug 210 functions as a contact (shared contact) that connects the FD region 205 to the gate electrode 207 of the amplifying MOS transistor. A "shared contact" is a contact which is a plug disposed in one contact hole and connects the active region to the gate electrode without a wiring. A barrier metal 211 is provided between the first plug 210 and the first insulating film 209. The barrier metal 211 may have a multilayer structure or a single layer structure. A second plug 212 is electrically connected to the active region 208. A barrier metal 213 is provided between the second plug 212 and the first insulating film 209. A second insulating film 214 is disposed on the first insulating film 209, the first plug 210 and the second plug 212. A third insulating film 215 is disposed on the second insulating film 214. A third plug 216 is disposed in the second insulating film 214. A first wiring 217 is disposed in the third insulating film 215. A barrier metal 218 is provided for the third plug 216 and the first wiring 217. The third plug 216 and the first wiring 217 constitute a dual damascene structure. The second plug 212 and the third plug 216 constitute a stack contact structure. The active region 208 is electrically connected to the first wiring 217 through this stack contact structure. The wirings that are disposed at the same height as the first wiring 217 with respect to the upper surface of the substrate 200 are collectively referred to as a "first wiring layer". The first wiring 217 is a wiring closest to the substrate 200 in a multilayer interconnection structure in which many metal wirings are layered.

In this structure, since the FD region 205 is connected to the gate electrode 207 via a shared contact structure, a wiring for this connection is no longer needed. Since the number of wirings is reduced, the design flexibility of the wiring layout is improved. Here, an example in which a second wiring 219 different from the first wiring 217 and electrically isolated from the FD region 205 is disposed on the shared contact structure is given. Formation of the second wiring 219 can reduce the light entering the FD region 205. A barrier metal 220 is provided for the second wiring 219. It should be noted that the second wiring 219 is not always necessary. Since the aperture of the photoelectric conversion element is widened by the absence the second wiring 219, obliquely incident light can be easily captured.

A fourth insulating film 221 serves as a diffusion preventing film for reducing diffusion of the materials of the first wiring 217 and the second wiring 219 into a semiconductor substrate and the like. The fourth insulating film 221 is covered with a fifth insulating film 222. Although not shown in the drawing, a dual damascene structure may be disposed above the first wiring 217 and in the fifth insulating film 222 and the fourth insulating film 221. A first opening 223 is formed in the second insulating film 214, and a second opening 224 is formed in the fourth insulating film 221. In an actual application, a color filter, a micro lens, and other associated components are formed above the fourth insulating film 221.

The height of the stack contact structure of this embodiment will now be described. For the comparative purposes, assume that a stack contact structure is formed by forming a third plug 216 above a second plug 212 and forming a first wiring 217 to have a single damascene structure. In such a case, after the conductor constituting the third plug 216 is formed, e.g., after tungsten is deposited, a chemical mechanical polishing (CMP) step is needed. Thus, the process margin for the CMP step must be secured. In other words, the insulating film must be thick to allow the margin. In contrast, according to the stack contact structure of this embodiment, the conductors of the third plug 216 and the first wiring 217 have a dual damascene structure and so that the conductors can be buried simultaneously. Thus, the process margin corresponding to one CMP step is not needed, and the thickness of the insulating film can be reduced. The resulting structure including a plug and a dual damascene structure stacked on each other can help reduce the height of the photoelectric conversion element.

Next, the materials of the respective insulating films are described. In this embodiment, the first insulating film 209 is composed of a material that can withstand etching of the second insulating film 214. The second insulating film 214 is composed of a material that can withstand etching of the third insulating film 215. For example, the first insulating film 209 is composed of silicon oxide, the second insulating film 214 is composed of silicon nitride, and the third insulating film 215 is composed of silicon oxide. When such materials are used, the first insulating film 209 is not excessively etched even when misalignment occurs in the etching step for forming the third plug 216. This is because the first insulating film 209 can withstand etching of the second insulating film 214. Compared to the case in which a plurality of insulating films, including a film that has etching resistance, are provided to form the third insulating film, the thickness can be reduced. The detail is described below. The fourth insulating film 221 is composed of silicon nitride and the fifth insulating film 222 is composed of silicon oxide.

In the case where the above-described materials are used to form the first to fifth insulating films, interfaces are formed between insulating films having different refractive indices. When the first opening 223 and the second opening 224 corresponding to the photoelectric conversion element are formed, it becomes possible to avoid the interface between the insulating films of different refractive indices from coming above the photoelectric conversion element. In other words, it becomes possible to reduce the reflection at the interfaces of the insulating films disposed above the photoelectric conversion element. Of course, the insulating films in which the openings are to be formed can be adequately selected.

Figure 2A:
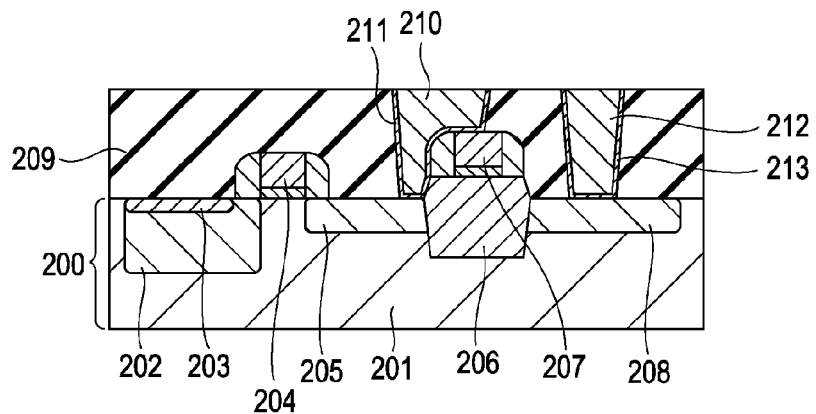
FIGS. 2A to 2C are cross-sectional schematic diagrams illustrating a manufacture method of the first embodiment.

A method for making the photoelectric conversion device shown in FIG. 1 will now be described with reference to FIGS. 2A to 2C. In FIG. 2A, elements such as a photoelectric conversion element and a MOS transistor are formed in the substrate 200 by a typical semiconductor manufacturing method, and the first insulating film 209 is formed on the substrate 200. Next, contact holes including a first hole and a second hole are formed at desired positions of the first insulating film 209 by photolithography. The contact holes are buried with conductors such as barrier metals and tungsten, and the surface is etched or polished. As a result, excessive barrier metals and conductors are removed, the first hole is filled with the first plug 210 and the barrier metal 211, and the second hole is filled with the second plug 212 and the barrier metal 213 to thereby form a shared contact and a contact.

Figure 2B:
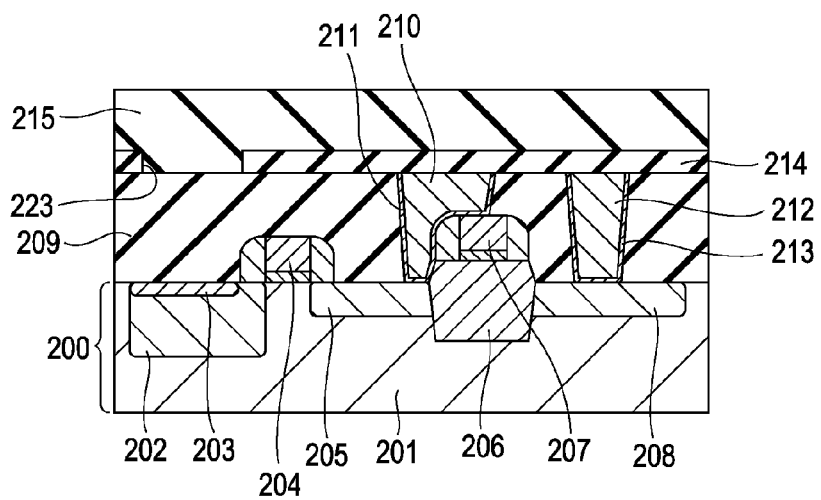
Figure 2C:
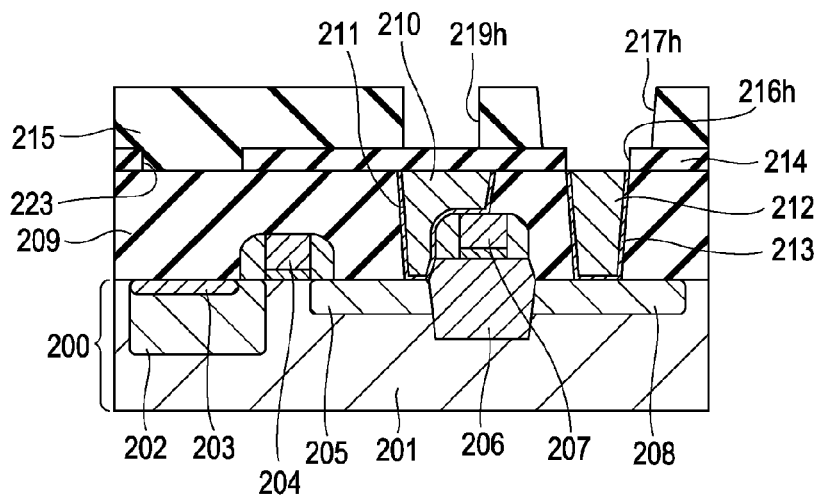

As shown in FIG. 2B, the second insulating film 214 covering the first plug 210 and the second plug 212 is formed. The first opening 223 is formed in the second insulating film 214 by photolithography. The third insulating film 215 covering the first opening 223 and the second insulating film 214 is then formed. The first insulating film 209 and the third insulating film 215 may be made by using silicon oxide or the like, and the second insulating film 214 may be made by using a film composed of a low dielectric constant (low-k) material or silicon nitride. Next, as shown in FIG. 2C, a first opening 217h, a second opening 216h, and an opening 219h are photolithographically formed in the third insulating film 215. To be more specific, the opening 219h and the first opening 217h are first formed by etching. At this time, the second insulating film 214 can be used as the etching stopper. Then the second opening 216h is formed by photolithography and etching. Even when misalignment occurs during etching, the first insulating film 209 serves as the etching stopper and excessive etching can be suppressed. The second opening 216h is a via hole for the third plug and is also referred to as a "third hole".

The first opening 217h and the opening 219h are trenches for wiring and this wiring is the bottommost wiring. Here, the second opening 216h can be formed first and then the first opening 217h and the opening 219h can be formed next. In such a case also, the second insulating film 214 can be used as an etching stopper, and the first insulating film 209 serves as an etching stopper in the case of misalignment during formation of the second opening 216h.

Then the films of barrier metals and conductors are formed and excess parts are removed to form the second wiring 219, the barrier metal 220 of the second wiring 219, the dual damascene structure, and the barrier metal 218 of the dual damascene structure. In particular, examples of the materials for the barrier metal 211, the barrier metal 213, etc., include tantalum and tantalum nitride. Tantalum and tantalum nitride are formed into films by sputtering. The first wiring 217 and the third plug 216 forming the dual damascene structure and the second wiring 219 are, for example, made of copper by electrolytic plating. The barrier metals and copper are formed into films covering the opening 219h and the like and ground by etching or CMP to remove excess parts. Then the fourth insulating film 221 covering the first wiring 217, the second wiring 219, and the third insulating film 215 is formed. The subsequent steps are the same as those shown in FIGS. 2B and 2C. After a plurality of wirings and vias are formed, a protective film, an inner layer lens, a color filter, a micro lens, and the like are formed to end fabrication of the photoelectric conversion device. As described above, by using the second insulating film 214 as an etching stopper, shape control during formation of the dual damascene structure is simplified and the yield can be improved. Moreover, since a dual damascene structure is disposed on the second plug 212, the design flexibility of the wiring layout can be improved and the height reduction can be achieved.

Figure 3A:
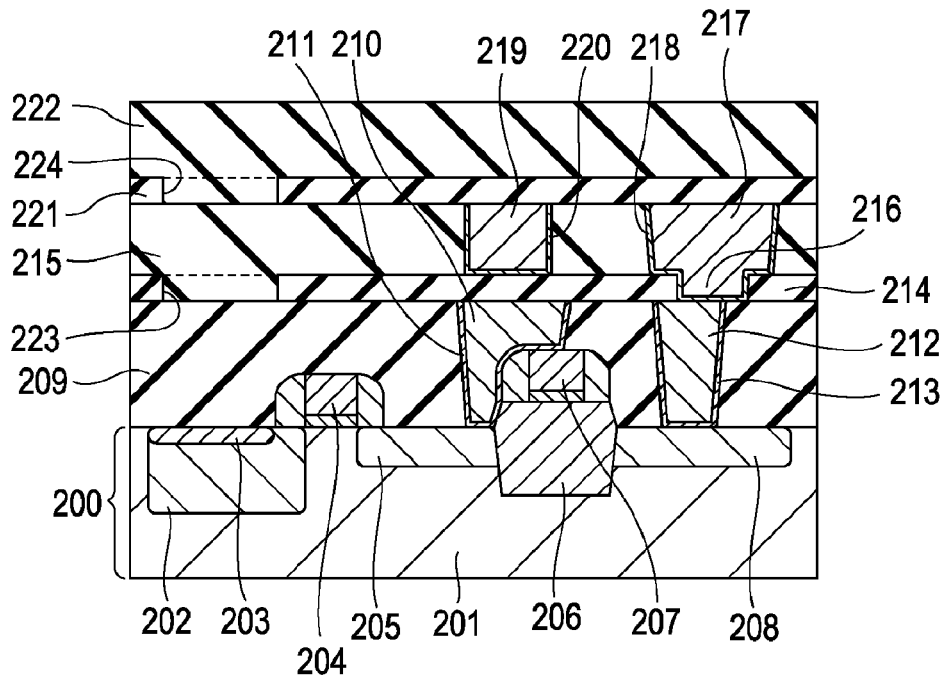
FIG. 3A is a cross-sectional schematic diagram illustrating the first embodiment and FIG. 3B is a cross-sectional schematic diagram illustrating a comparative example.
Figure 3B:
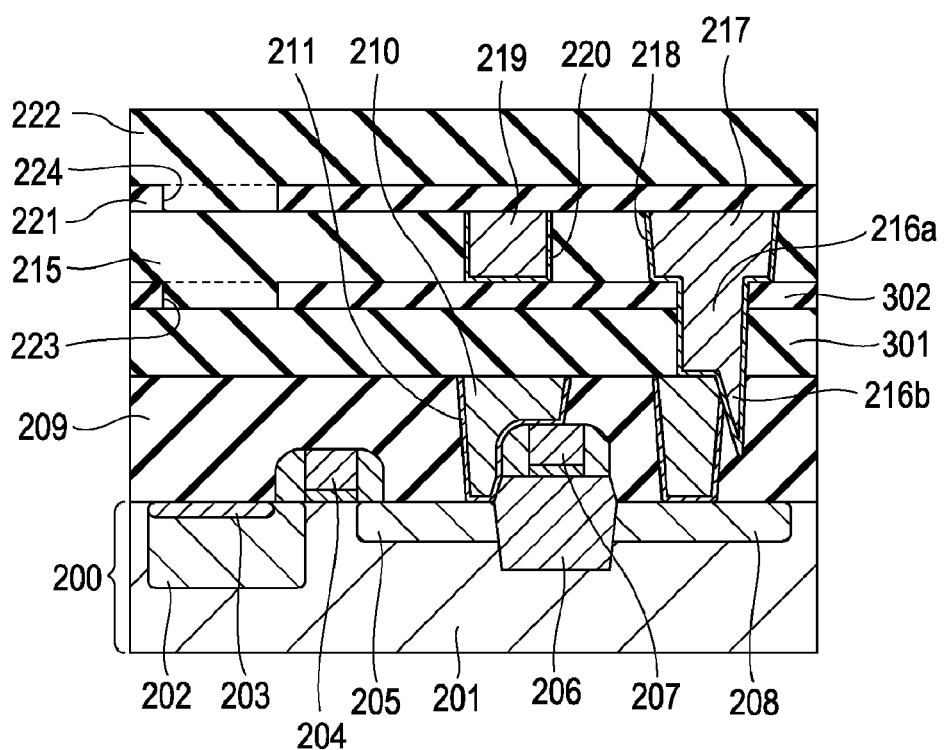

The present embodiment will now be described in comparison with a comparative structure by referring to FIGS. 3A and 3B. FIG. 3A is a cross-sectional schematic diagram of the same photoelectric conversion device as in FIG. 1. FIG. 3B shows a comparative structure. In the comparative structure, an insulating film 301 and an insulating film 302 are provided instead of the second insulating film 214 in which the third plug 216 is formed. According to the comparative structure shown in FIG. 3B, since a third plug 216a has a thickness corresponding to the total thickness of the two layers, i.e., the insulating film 301 and the insulating film 302, the layer in which the first wiring 217 is formed is more distant from the light-receiving surface of the photoelectric conversion element than the structure shown in FIG. 3A. In particular, in FIG. 3B, when the insulating film 301 is 300 nm thick and the insulating film 302 is 100 nm thick, the height of the third plug 216a is 400 nm. In contrast, in FIG. 3A, when the second insulating film 214 is 100 nm thick, then the height of the third plug 216 is 100 nm, and this contributes to height reduction.

In FIG. 3A, when the first opening 217h of the first wiring 217 is formed in the third insulating film 215, the second insulating film 214 functions as an etching stopper. Accordingly, excessive etching can be suppressed during formation of the first opening 217h. When the second opening 216h for the third plug 216 is formed in the second insulating film 214, the first insulating film 209 functions as an etching stop layer. Accordingly, excessive etching can be suppressed during formation of the second opening 216h. In contrast, according to the structure shown in FIG. 3B, excessive etching occurs during formation of an opening for the third plug 216a if there is no etching selection ratio between the insulating film 301 and the first insulating film 209. As shown in FIG. 3B, the plug material forms an extended part 216b as a result. There is also a risk of diffusion of copper that should serve as a plug material and abnormal growth of tungsten. In FIG. 3A, even when the second plug 212 and the third plug 216 are misaligned, the first insulating film 209 functions as an etching stopper and excessive etching is thereby prevented. The yield is improved as a result.

Alternatively, all insulating films in which vias of the dual damascene structure are formed may be composed of silicon nitride as with the second insulating film 214. Since silicon nitride has a high dielectric constant, formation of a silicon nitride film between wirings increases the coupling capacitance between the wirings. Thus, as in this embodiment, only the insulating film covering the shared contact structure is made of silicon nitride to decrease the capacitance between the wirings and suppress a decrease in readout operation speed.

According to this embodiment, the height reduction can be achieved since the thickness of the insulating films is reduced without decreasing the design flexibility of the wiring layout. Moreover, since the process margin is not needed, the thickness of the insulating films can be decreased and thus further height reduction is achieved. As a result, a high-quality MOS-type photoelectric conversion device having a light quantity independent from the F number, i.e., having a light quantity that does not easily change from a high incidence angle region to a low incidence angle region, can be provided. Thus, a MOS-type photoelectric conversion device in which the light collecting efficiency to the photoelectric conversion element is improved can be provided.

Second Embodiment

Application to Imaging System

In a second embodiment, an example in which the photoelectric conversion device of the first embodiment is applied to an imaging system is described with reference to FIG. 5. An "imaging system" is a digital still camera, a digital video camera, a cellular phone digital camera, or the like.

Figure 5:
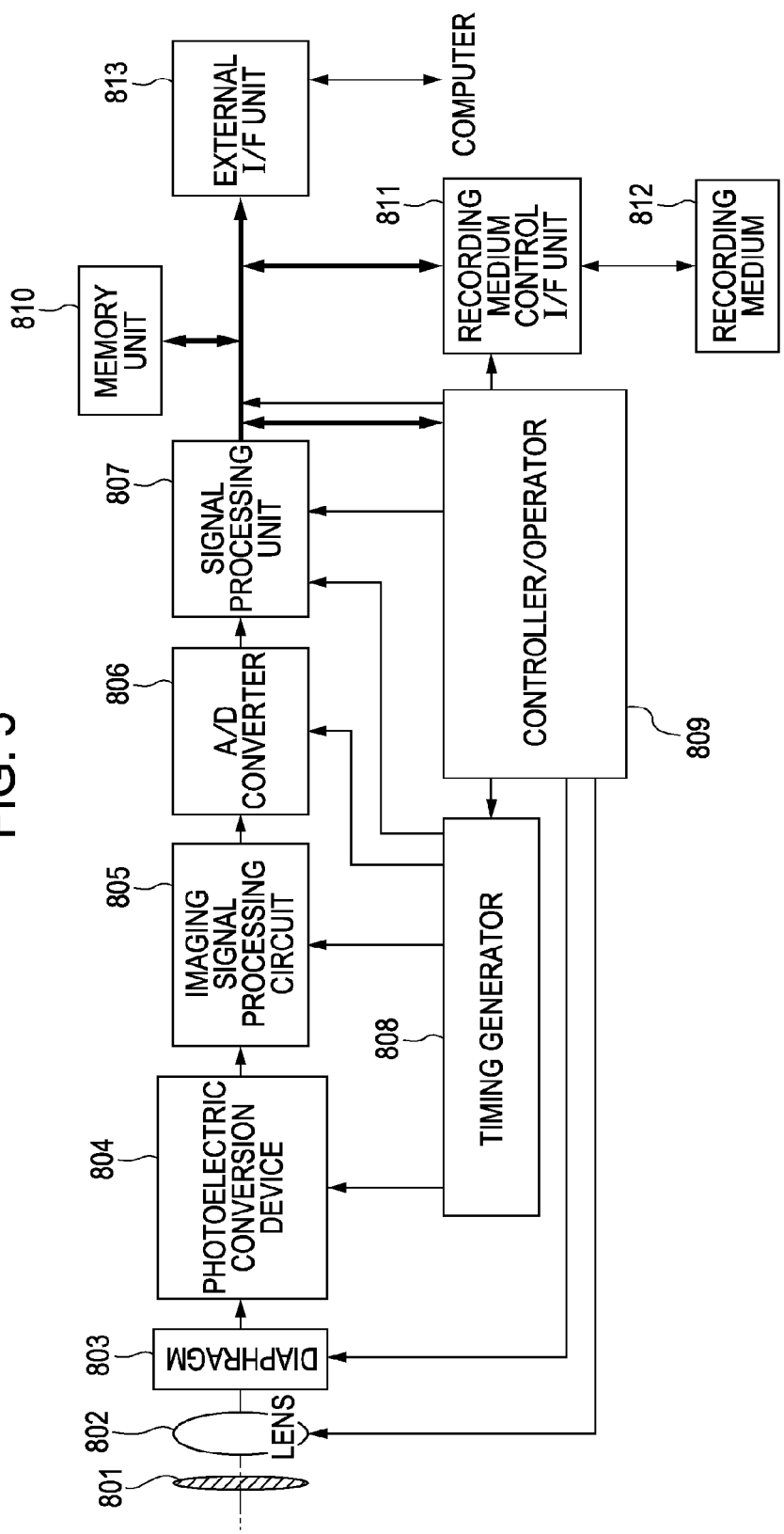
FIG. 5 is a block diagram illustrating an imaging system.

FIG. 5 is a diagram showing the structure of a digital still camera. An optical image of a subject is focused on an imaging plane of a photoelectric conversion device 804 by an optical system including a lens 802 and the like. A barrier 801 that serves as a protector for the lens 802 and a main switch can be formed at the outer side of the lens 802. The lens 802 can be provided with a diaphragm 803 for controlling the quantity of light emitted from the lens 802. Imaging signals output via multiple channels from the photoelectric conversion device 804 are subjected to various processes such as correction and clamping in an imaging signal processing circuit 805. Imaging signals output through multiple channels from the imaging signal processing circuit 805 are subjected to analog-digital conversion in an A/D converter 806. The image data output from the A/D converter 806 is subjected to various processing such as correction and data compression in a signal processing unit (image processing unit) 807. The photoelectric conversion device 804, the imaging signal processing circuit 805, the A/D converter 806, and the signal processing unit 807 are operated in accordance with a timing signal generated by a timing generator 808. Each block is controlled by an overall controller/operator 809. A memory unit 810 for temporarily storing the image data and a recording medium control I/F unit 811 for recording an image on or reading an image from a recording medium are also provided. A recording medium 812 is constituted by a semiconductor memory and the like and can be loaded and unloaded. An external interface (I/F) unit 813 for communicating with an external computer may also be provided. The imaging signal processing circuit 805, the A/D converter 806, the signal processing unit 807, and the timing generator 808 may be formed on the same chip as the photoelectric conversion device 804.

The operation of the system shown in FIG. 5 is described next. In response to opening of the barrier 801, the main power supply, the power supply for the control system, and the power supply for the imaging circuits such as the A/D converter 806 are sequentially turned ON. Subsequently, the overall controller/operator 809 opens the diaphragm 803 to control the exposure. A signal output from the photoelectric conversion device 804 is supplied to the A/D converter 806 through the imaging signal processing circuit 805. The A/D converter 806 performs A/D conversion on the signal and output the converted signal to the signal processing unit 807. The signal processing unit 807 processes the data and supplies the data to the overall controller/operator 809. The operation for determining the exposure is conducted in the overall controller/operator 809. Next, the overall controller/operator 809 extracts a high-frequency component from the signal output from the photoelectric conversion device 804 and processed in the signal processing unit 807 to calculate the distance to the subject on the basis of the high-frequency component. Then the lens 802 is driven to determine whether the lens is in focus. If the lens is out of focus, the lens 802 is driven again and the distance is calculated. After the lens is confirmed to be in focus, main exposure starts. After completion of the exposure, the imaging signal output from the photoelectric conversion device 804 is subjected to correction and the like in the imaging signal processing circuit 805, subjected to A/D conversion in the A/D converter 806, and processed in the signal processing unit 807. The image data processed in the signal processing unit 807 is stored in the memory unit 810 by the overall controller/operator 809. Then the image data stored in the memory unit 810 is recorded on the recording medium 812 via the recording medium control I/F unit 811 by the control of the overall controller/operator 809. The image data is supplied to a computer and the like via the external I/F unit 813 and processed.

As described above, the photoelectric conversion device of the present invention is applicable to an imaging system.

The photoelectric conversion device of the present invention can achieve an improved light collecting efficiency on the photoelectric conversion element without decreasing the design flexibility of the wiring layout.

The invention is not limited to the embodiments described above. The conductivity type may be reversed and the embodiments may be combined with one another.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims the benefit of Japanese Patent Application No. 2008-253995 filed Sep. 30, 2008, which is hereby incorporated by reference herein in its entirety.

What is claimed is:

1. A method for making a photoelectric conversion device that includes a semiconductor substrate, a photoelectric conversion element and MOS transistors disposed on the semiconductor substrate, and a multilayer interconnection structure constituted by a plurality of wiring layers stacked with insulating films in between, the method comprising:

forming a first insulating film on the semiconductor substrate;

forming a first hole and a second hole in the first insulating film, the first hole exposing a plurality of active regions in the semiconductor substrate, a plurality of gate electrodes of the plurality of MOS transistors, or an active region and a gate electrode of a MOS transistor, and the second hole exposing one of the plurality of active regions;

forming conductors in the first hole and the second hole to form a first plug in the first hole and a second plug in the second hole;

forming a second insulating film on the first insulating film, the first plug, and the second plug, the second insulating film being contacted with the first insulating film;

forming a third insulating film on the second insulating film;

forming a first opening for a wiring of a dual damascene structure in the third insulating film while using the second insulating film as an etching stopper, the wiring serving as a bottommost layer of a multilayer interconnection structure;

forming a second opening for the dual damascene structure, the second opening being formed as a via hole in the second insulating film and exposing the second plug; and forming conductors in the first opening and the second opening to form the dual damascene structure.

2. The method according to claim 1, further comprising, before the forming the third insulating film:

forming an opening in the second insulating film and above the photoelectric conversion element.

3. The method according to claim 1, wherein the first insulating film and the third insulating film are composed of a same material.

4. The method according to claim 1, wherein the first insulating film is composed of silicon oxide, and the second insulating film is composed of silicon nitride.

5. The method according to claim 1, wherein the first plug functions as a contact that connects a floating diffusion region to a gate electrode of an amplifying MOS transistor of the plurality of MOS transistors.

6. The method according to claim 1, further comprising, forming, after forming the conductors in the first opening and the second opening to form the dual damascene structure, a fourth insulating film on the dual damascene structure.

7. The method according to claim 1, further comprising, forming another wiring in the third insulating film and on the first plug.

8. A photoelectric conversion device comprising:

a semiconductor substrate;

a photoelectric conversion element and a plurality of MOS transistors disposed on the semiconductor substrate;

a first insulating film on the semiconductor substrate;

a second insulating film on the first insulating film, the second insulating film being contacted with the first insulating film;

a third insulating film on the second insulating film;

a wiring disposed in the third insulating film, the wiring being a wiring layer closest to the semiconductor substrate;

a first plug disposed in a first hole formed in the first insulating film, the first plug electrically connecting a plurality of active regions in the semiconductor substrate to each other, gate electrodes of the plurality of MOS transistors to each other, or a gate electrode of a MOS transistor to an active region in the semiconductor substrate;

a second plug disposed in a second hole formed in the first insulating film, the second plug being electrically connected to one of a plurality of active regions; and a third plug disposed in a third hole formed in the second insulating film, the third plug being electrically connected to the second plug to make up a dual damascene structure together with the wiring, wherein the first insulating film is composed of a material configured to withstand etching of the second insulating film, and the second insulating film is composed of a material configured to withstand etching of the third insulating film.

9. An imaging system comprising:
the photoelectric conversion device according to claim 8; and
a signal processing circuit configured to process a signal from the photoelectric conversion device.

10. The system according to claim 9, wherein the first insulating film and the third insulating film are composed of a same material.

11. The system according to claim 9, wherein the first insulating film is composed of silicon oxide, and
the second insulating film is composed of silicon nitride.

12. The photoelectric conversion device according to claim 8, wherein the first insulating film and the third insulating film are composed of a same material.

13. The photoelectric conversion device according to claim 8, wherein the first insulating film is composed of silicon oxide, and
the second insulating film is composed of silicon nitride.

14. The photoelectric conversion device according to claim 8, wherein the first plug functions as a contact that connects a floating diffusion region to a gate electrode of an amplifying MOS transistor of the plurality of MOS transistors.

15. The photoelectric conversion device according to claim 8, further comprising a fourth insulating film on the wiring.

16. The photoelectric conversion device according to claim 8, further comprising another wiring, the another wiring being in the third insulating film and being on the first plug.

* * * * *